United States Patent [19]

Yoshihara et al.

[11] Patent Number: 4,768,220
[45] Date of Patent: Aug. 30, 1988

[54] CHANNEL SELECTION IN A MULTICHANNEL ACCESS RADIO COMMUNICATION SYSTEM WITHOUT OCCURRENCE OF INTERFERENCE

[75] Inventors: Shigeo Yoshihara; Hideo Miyashita, both of Tokyo, Japan

[73] Assignee: NEC Corporation, Tokyo, Japan

[21] Appl. No.: 868,453

[22] Filed: May 30, 1986

[30] Foreign Application Priority Data

May 30, 1985 [JP] Japan .............................. 60-117613

[51] Int. Cl.⁴ .............................................. H04Q 7/04
[52] U.S. Cl. ........................................ 379/63; 379/61; 379/58; 455/77
[58] Field of Search ....................... 455/33, 32, 34, 77; 379/60, 61, 62, 63

[56] References Cited

U.S. PATENT DOCUMENTS

| | | | |
|---|---|---|---|
| 4,555,805 | 11/1985 | Talbot .................................. | 455/26 |
| 4,633,509 | 12/1986 | Scheinert ............................. | 455/33 |
| 4,649,567 | 3/1987 | Childress ............................. | 455/17 |
| 4,654,879 | 3/1987 | Goldman et al. ................... | 455/33 |
| 4,658,416 | 4/1987 | Tanaka ................................. | 379/57 |
| 4,672,657 | 6/1987 | Dershowitz .......................... | 379/63 |

*Primary Examiner*—Robert Lev

*Attorney, Agent, or Firm*—Sughrue, Mion, Zinn, Macpeak, and Seas

[57] ABSTRACT

In a channel selecting device which is for use in a station of a multichannel access radio communication system comprising that station and a plurality of other stations, a control channel, and a predetermined number of speech channels and which includes a channel selector (11, 12, and 14) for selecting one of the speech channels as a selected channel on starting communication with a specific station of the system, a channel detecting arrangement (11, 12, and 14) is coupled to the control channel to detect channel codes of busy channels which are rendered busy among the speech channels by at least two of the other stations. The channel detecting arrangement is operable while the first-mentioned station is in an idle state. A memory unit (30) is coupled to the channel detecting arrangement and stores the channel codes of the busy channels. The channel selector is coupled to the memory unit to select the selected channel from idle channels which are other than the busy channels. Preferably, an erasing arrangement (11, 12, and 14) erases each of the channel codes from the memory unit upon lapse of a predetermined time interval after storage of that channel code in the memory unit. The erasing arrangement may erase all channel codes from the memory unit when a manually operable switch (23) is operated after all channel codes are memorized in the memory unit.

6 Claims, 5 Drawing Sheets

CHANNEL SELECTION IN A MULTICHANNEL ACCESS RADIO COMMUNICATION SYSTEM WITHOUT OCCURRENCE OF INTERFERENCE

BACKGROUND OF THE INVENTION

This invention relates to a channel selecting device for use in a station of a multichannel access radio communication system. The station is typically a personal radio transceiver.

A radio communication system of the type described, comprises a control channel and a predetermined number of speech or other communication channels. The control and the speech channels are of different radio frequencies in, for example, a 900-megahertz band and are shared by stations of the system. The stations of the system are assigned with different station codes, respectively.

The channel selecting device of each station includes a channel selector. For clarity of discussion, reference is made to first through fourth stations with the system. The channel selector of the first station is used in selecting one of the communication channels as a selected channel on starting communication with the second station. When the third and fourth stations are communicating with each other by the use of a special channel among the communication channels, the channel selector of the first station may select the special channel upon initiation of communication with the second station as the selected channel. This gives rise to interference among the first, second, and the third and fourth stations in the manner which will later be described in detail.

SUMMARY OF THE INVENTION

It is therefore an object of this invention to provide a channel selecting device for use in a station of a multichannel access radio communication system, which device is capable of achieving channel selection without occurrence of such interference.

Other objects of this invention will become clear as the description proceeds.

A channel selecting device to which this invention is applicable, is for use in a station of a multichannel access radio communication system comprising a control channel and a predetermined number of communication channels having channel codes, respectively. The device includes channel selecting means for selecting one of the communication channels as a selected channel on starting communication with a specific station of other stations of the system. According to this invention, the device comprises detecting means for coupling to the control channel and for detecting the channel codes of busy channels which are rendered busy among the communication channels by at least two of the other stations. The detecting means is operable while the first-mentioned station is in an idle state. The device further comprises storing means coupled to the detecting means for storing the channel codes of the busy channels. The channel selecting means is coupled to the storing means to select the selected channel from idle channels which are different from the busy channels.

BRIEF DESCRIPTION OF THE DRAWINGS

FIGS. 5($a$) and ($b$) collectively show a flow chart for use in describing operation of a channel selecting device according to a second embodiment of this invention.

DESCRIPTION OF THE PREFERRED EMBODIMENTS

Figure 1:
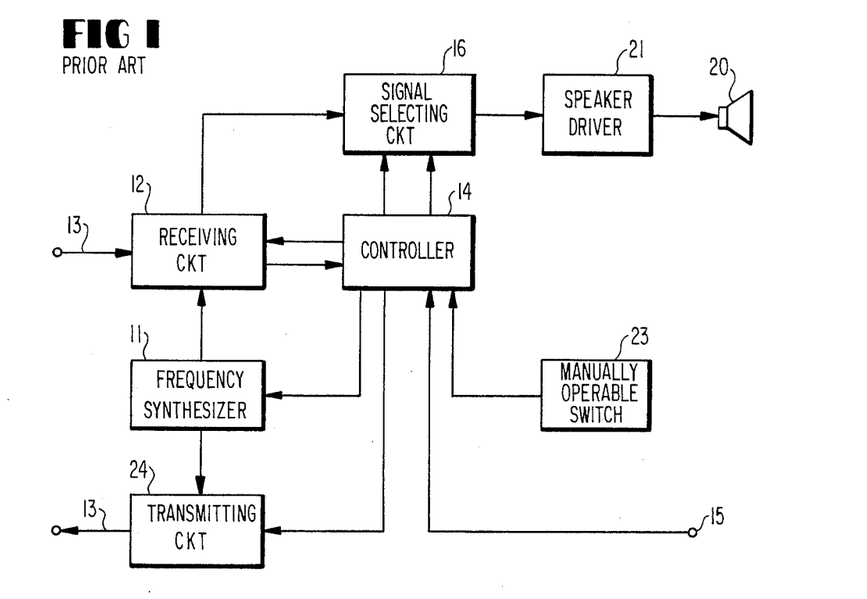
FIG. 1 is a block diagram of a conventional channel selecting device.

Referring to FIG. 1, a conventional channel selecting device will be described at first for a better understanding of this invention. The channel selecting device is for use in a station of a multichannel access radio communication system. The system comprises the first-mentioned station, a plurality of other stations, a control channel, and a predetermined number of speech or other communication channels. Each of the other stations has a structure which is similar to the structure being illustrated. It should therefore be understood in interpreting the appended claims that the illustrated station depicts the other stations as well. The communication channels will be called the speech channels throughout the description of the preferred embodiments. The control and the speech channels are given channel codes, respectively. The number of speech channels is, for example, fifty. The control and the speech channels are for common use by the stations of the system. The stations are assigned with different station codes, respectively.

Each of the stations is capable of communicating with a different one of the stations with an idle channel of the speech channels selected. When a particular station of the stations starts communication with a specific station of the other stations, the particular station transmits a call signal through the control channel. It will be assumed merely for convenience of description that the speech channels include at least one idle channel. The particular station selects the idle channel. With the idle channel selected as a selected channel, the particular station makes the call signal comprise the station code of the specific station and the channel code of the selected channel. The station code of the specific station will be called a specific code. After transmission of the call signal, the particular station is operatively decoupled from the control channel. Instead, the particular station is operatively coupled to the selected channel. In this manner, the selected channel becomes a busy channel.

The other stations may be idle or busy. Each idle station receives the call signal through the control channel and detects whether or not the station code of the call signal corresponds to the station code which is specific to that idle station. It will be presumed that the specific station is idle. In this instance, the station code of the call signal is the specific code. After detection of the specific code, the specific station is operatively decoupled from the control channel and is operatively coupled to the selected channel which is designated by the channel code of the call signal. The particular and the specific stations are now ready for exchange of speech signals with each other through the selected channel.

Each station comprises a frequency synthesizer 11 for producing a frequency signal in response to a designation signal which will presently be described. The frequency signal specifies the control channel and then one of the speech channels. A receiving circuit 12 is for coupling or connection to the control and the speech channels which are collectively shown at 13. Controlled by the frequency signal, the receiving circuit 12 successively receives the call and the speech signals to produce a received call signal and a received speech signal. Although not separately depicted, the receiving circuit 12 comprises an amplifier/detector which is responsive to the call and the speech signals for producing the received call and speech signals.

A controller 14 has a call request terminal 15. In the manner which will later be described in detail, the controller 14 is supplied with the received call signal at first from the receiving circuit 12 and delivers the above-mentioned designation signal to the frequency synthesizer 11. Subsequently, the controller 14 produces a selection signal to control a signal selecting circuit 16. As the case may be, the controller 14 produces an alarm signal. Responsive to the selection signal, the signal selecting circuit 16 selects either the received speech signal sent directly from the receiving circuit 12 or the alarm signal sent from the controller 14. The signal selected by the signal selecting circuit 16 as a selected signal, is delivered to a loudspeaker 20 through a speaker driver 21.

A manually operable switch 23 is coupled to the controller 14 for the purpose which will later be described. A transmitting circuit 24 is coupled to the control and the speech channels which are separately depicted from the first-mentioned ones and nevertheless are designated by the reference numeral 13. When the illustrated station serves as a particular station which is for transmitting a call signal to a particular station, a call request is supplied to the call request terminal 15. Responsive to the call request, the controller 14 delivers a designation signal and the call signal to the frequency synthesizer 11 and the transmitting circuit 24, respectively. The call signal is allotted to the control channel in the transmitting circuit 24. Thereafter, the controller 14 makes the frequency synthesizer 11 produce a frequency signal which specifies an idle channel as a selected channel.

Figure 2:
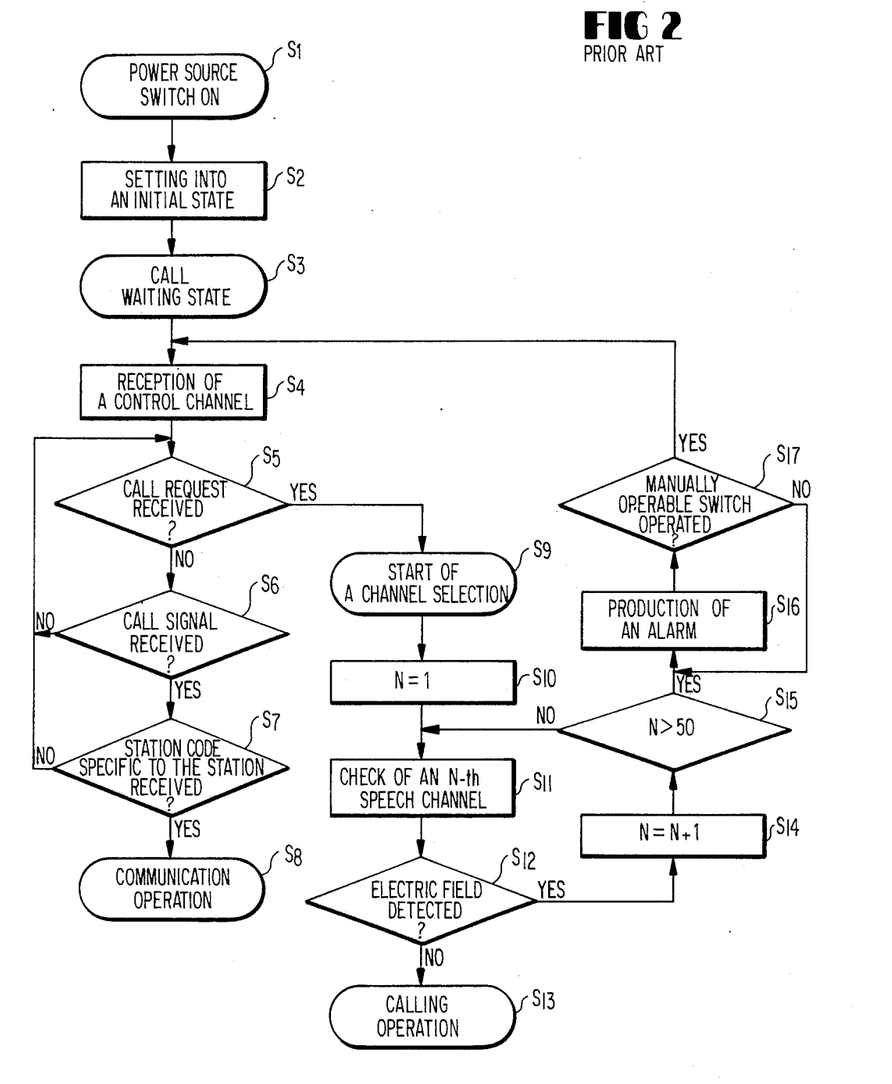
FIG. 2 is a flow chart for use in describing operation of the channel selecting device illustrated in FIG. 1.

Referring to FIG. 2 in addition to FIG. 1, operation of the each station will be described more in detail. When a power source switch (not shown) is closed at a first stage $S_1$, the station is put into an initial state as shown at a second stage $S_2$ with the controller 14 reset. The second stage $S_2$ proceeds to a third stage $S_3$ at which the station is put in an idle state or a call waiting state. The third stage $S_3$ is followed by a fourth stage $S_4$ at which the controller 14 produces the designation signal for the frequency signal specific to the control channel. The control channel is thereby operatively coupled to the receiving circuit 12. The fourth stage $S_4$ is therefore labelled "reception of a control channel."

The fourth stage $S_4$ proceeds to a fifth stage $S_5$ at which the controller 14 checks whether or not a call request is supplied to the call request terminal 15. When the call request is not received, the illustrated station remains in the idle state. The fifth stage $S_5$ is followed by a sixth stage $S_6$. At the sixth stage $S_6$, the controller 14 checks whether or not the receiving circuit 12 receives a call signal from one of the other stations through the control channel. When the call signal is not received, the sixth stage $S_6$ returns back to the fifth stage $S_5$. When the call signal is received, the sixth stage $S_6$ proceeds to a seventh stage $S_7$ at which the controller 14 checks whether or not the received station code of the call signal coincides with the station code specific to the station in question. Upon detection of the coincidence, an eighth stage $S_8$ follows the seventh stage $S_7$. Otherwise, operation returns to the fifth stage $S_5$.

At the eighth stage $S_8$, the controller 14 detects the channel code of the call signal. The channel code specifies the speech channel selected as a selected channel by a calling station which is described above as the particular station with the station under consideration called the specific station and with the channel code called the specific code. Responsive to the specific code, the controller 14 produces a designation signal to make the frequency synthesizer 11 generate the frequency signal for the selected channel. The receiving circuit 12 is operatively decoupled from the control channel and operatively coupled instead to the speech channel specified by the specific code. The receiving circuit 12 is put in a state of receiving the speech signal from the calling station. The eighth stage $S_8$ is therefore labelled "communication operation."

When the controller 14 receives the call request, the fifth stage $S_5$ proceeds to a ninth stage $S_9$ of starting a channel selecting operation. At the ninth stage $S_9$, the controller 14 is put in a set state. It will now be assumed that the station under consideration is a particular station and that the call request is for a specific station of the other stations. The channel codes will be represented by a variable N. At first, the controller 14 sets the variable N at 1 at a tenth stage $S_{10}$ which follows the ninth stage $S_9$. In the manner which will shortly be described, the variable N is counted up one by one. It will be assumed that the variable is counted up to N (the same reference letter being used) which specifies an N-th speech channel.

At the eleventh stage $S_{11}$, the controller 14 checks the N-th speech channel. In other words, the frequency signal couples the receiving circuit 12 operatively with the N-th speech channel. The eleventh stage $S_{11}$ is followed by a twelfth stage $S_{12}$ at which the controller 14 checks whether or not an electric field is detected at the N-th speech channel. If the electric field is absent for a predetermined time interval of, for example, one second, the controller 14 regards the N-th speech channel as an idle channel and selects the N-th speech channel as the afore-mentioned selected channel. The twelfth stage $S_{12}$ is followed by a thirteenth stage $S_{13}$ at which the controller 14 carries out a calling operation. More particularly, the controller 14 produces a designation signal to make the frequency synthesizer 11 generate a frequency signal representative of the control channel. The controller 14 controls the transmitting circuit 24 to make the latter send a call signal which comprises the station code for the specific station and the channel code for the N-th speech channel. The call signal is delivered to other stations of the radio communication system through the control channel.

If the electric field is detected in the N-th speech channel, the twelfth stage $S_{12}$ proceeds to a fourteenth stage $S_{14}$ at which the controller 14 sets the variable N at (N+1). A fifteenth stage $S_{15}$ follows the fourteenth stage $S_{14}$. At the fifteenth stage $S_{15}$, the controller 14 checks whether or not the variable N is greater than the number of all speech channels, namely, fifty. If the variable N is not greater than fifty at the fifteenth stage $S_{15}$, the fifteenth stage $S_{15}$ returns to the eleventh stage $S_{11}$. In this manner, the variable N is counted up.

If the variable N is greater than fifty at the fifteenth stage $S_{15}$, a sixteenth stage $S_{16}$ next succeeds at which the controller 14 produces the alarm signal to indicate that all speech channels are busy. The controller 14 furthermore produces the selection signal which makes the signal selecting circuit 16 select the alarm signal rather than the speech signal supplied directly from the receiving circuit 12. The alarm signal is delivered to the loudspeaker 20 through the speaker driver 21 and generates an alarm tone. The manually operable switch 23 may or may not be operated. The controller 14 checks at a seventeenth stage $S_{17}$ whether or not the manually operable switch 23 is operated. If the switch 23 is operated, the controller 14 stops production of the alarm signal. The seventeenth stage $S_{17}$ returns to the fourth stage $S_4$. Otherwise, the seventeenth stage $S_{17}$ returns to the sixteenth stage $S_{16}$ so that the alarm tone continues.

Reviewing FIGS. 1 and 2, it is understood that a combination of the frequency synthesizer 11, the controller 14, and either the receiving circuit 12 or the transmitting circuit 24 serves as a channel selector at the ninth, the tenth, the eleventh, the twelfth, the fourteenth, and the fifteenth stages $S_9$, $S_{10}$, $S_{11}$, $S_{12}$, $S_{14}$, and $S_{15}$. The channel selector selects one of the idle channels as a selected channel on starting communication with the specific station. The controller 14 is operable as a bistable arrangement having a set and a reset state when a call request is received and while no call request is received, respectively. The manually operable switch 23 is coupled to the bistable arrangement to forcibly switch the bistable arrangement from the set state into the reset state. Incidentally, an assembly of the signal selecting circuit 16, the loudspeaker 20, and the speaker driver 21 may be regarded as an alarm generator for generating an alarm tone which indicates that all speech channels are busy.

In connection with FIGS. 1 and 2, it will again be assumed that the illustrated station is the first station and starts communication with the second station. When the third and fourth stations are communicating with each other by the use of a special channel of the speech channels, the above-mentioned channel selector of the first station may select the special channel as the selected channel. This gives rise to interference among the first, the second, and the third and fourth stations.

More particularly, a simplex transmission is generally used among at least two stations which are communicating with one another in the multichannel access radio communication system. Each station comprises a microphone and a press-to-talk switch, both not shown. When a bearer of a first station or an attendant thereto speaks to a second station, he presses or otherwise operates the press-to-talk switch to put the first station in a transmission state. While the press-to-talk switch is left released or kept unoperated, the first station remains in the idle state of waiting for a call signal.

It will be assumed that the first station begins to talk with the second station and that the third and fourth stations already are talking with each other through a speech channel which will be called a special speech channel. When it happens that the press-to-talk switches are pressed in neither of the third and fourth stations, the special speech channel looks as if it were an idle channel although the special speech channel is a busy channel in fact. Meanwhile, no electric field is present in the special speech channel. When the first station begins to select an idle channel in the meantime, the special speech channel may be selected. In this event, the first station will speak to the second and to the third and fourth stations.

Figure 3:
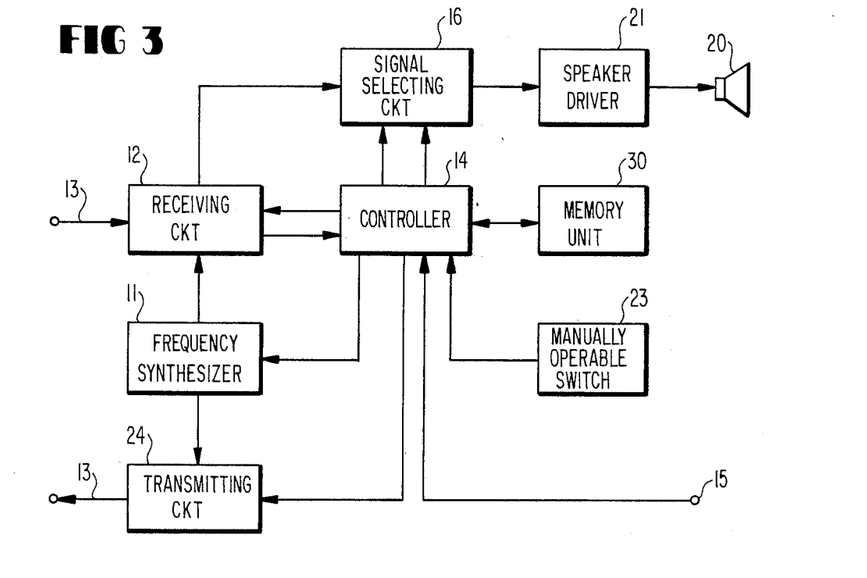
FIG. 3 shows a block diagram of a channel selecting device used according to a first embodiment of this invention in a multichannel access radio communication system.

Referring now to FIG. 3, a station of a multichannel radio communicating system comprises a channel selecting device according to a first embodiment of this invention. The channel selecting device comprises similar parts designated by like reference numerals. The channel selecting device further comprises a memory unit 30 coupled to the controller 14.

Figure 4:
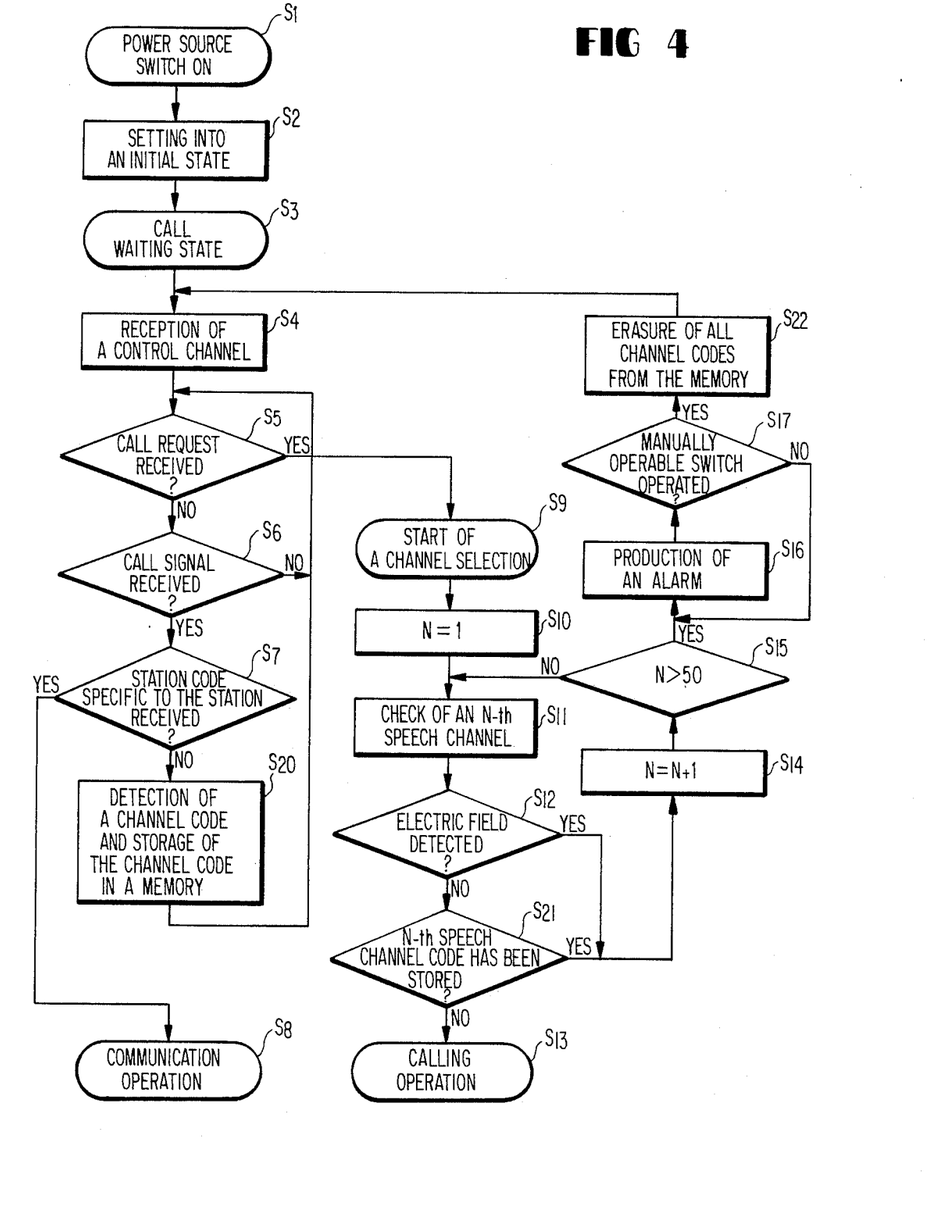
FIG. 4 is a flow chart for use in describing operation of the channel selecting device depicted in FIG. 3.

Referring to FIG. 4 together with FIG. 3, operation of the channel selecting device will be described. The operation is similar to that illustrated in FIG. 1 except for the following.

When the received station code of the call signal does not coincide with the station code specific to the station, the seventh stage $S_7$ is followed by a novel stage which will be called a twentieth stage $S_{20}$. At the twentieth stage $S_{20}$, the controller 14 detects the channel code of the selected channel from the received call signal. When the selected channel is detected, the controller 14 makes the memory unit 30 store the channel code. When communication begins between two of the other stations, the selected channel becomes a busy channel. The twentieth stage $S_{20}$ is followed by the fifth stage $S_5$ mentioned above.

Detection and storage of the channel code in the memory unit 30 is carried out at the twentieth stage $S_{20}$ by a channel detecting arrangement which is for coupling to the control channel. The channel detecting arrangement detects the channel codes of busy channels which are rendered busy among the speech channels by at least two of other stations. In the circuitry being illustrated, the channel detecting arrangement comprises the controller 14, receiving circuit 12, and the frequency synthesizer 11. As is apparent from FIG. 4, the channel detecting arrangement is operable only while the station is idle. In addition, the memory unit 30 is operable as a storing unit which is coupled to the channel detecting arrangement to store the channel codes of the busy channels.

When no electric field is detected in the N-th speech channel on operation of the above-mentioned channel selector, the twelfth stage $S_{12}$ is followed by a twenty-first stage $S_{21}$ at which the controller 14 detects whether or not a channel code of the N-th speech channel is already stored in the memory unit 30. When the channel code is already stored, the twenty-first stage $S_{21}$ is succeeded by the fourteenth stage $S_{14}$ mentioned above. When the channel code is not stored, the controller 14 regards the N-th speech channel as an idle channel. The above-mentioned calling operation is carried out at the thirteenth stage $S_{13}$. It is to be noted in the above-mentioned channel selecting device that the channel selector is operable in cooperation with the storing unit so as to select the selected channel from idle channels which are other than the busy channels among the speech channels. The channel selector is similar to that of the conventional channel selecting device except for the above-described operation.

When the controller 14 detects that the manually operable switch 23 is operated, the seventeenth stage $S_{17}$ proceeds to a twenty-second stage $S_{22}$ at which the controller 14 erases all of the channel codes from the memory unit 30. After erasure of all channel codes from the memory unit 30, the controller 14 puts the station into an idle state or call waiting state.

If all of the speech channel codes are already stored in the memory unit 30, the alarm tone is generated at the sixteenth stage $S_{16}$. The memory unit 30 is supervised as regards the number of the channel codes stored therein at the twenty-first, the fourteenth, the fifteenth, and the sixteenth stages $S_{21}$, $S_{14}$, $S_{15}$, and $S_{16}$.

In view of the foregoing, the controller 14 serves as a storage supervising arrangement for supervising the memory unit 30 to carry out the twenty-first, the fourteenth, the fifteenth, the sixteenth, the seventeenth, and the twenty-second stages $S_{21}$, $S_{14}$, $S_{15}$, $S_{16}$, $S_{17}$, and $S_{22}$. In other words, the storage supervising arrangement is coupled to the memory unit 30 to supervise whether or not the channel codes of all speech channels are stored in the memory unit 30.

When attention is directed to the twenty-second stage $S_{22}$ of erasing the channel codes from the memory unit 30, it is possible to call the storage supervising arrangement a monitoring arrangement which monitors the memory unit 30 to judge whether or not all of the channel codes are stored in the memory unit 30. That is, the monitoring arrangement carries out operation comprising the twenty-first, the fourteenth, the fifteenth, and the sixteenth stages $S_{21}$, $S_{14}$, $S_{15}$, and $S_{16}$. The controller 14 further serves as an erasing arrangement which is coupled to the monitoring arrangement for erasing all of the channel codes from the memory unit 30 when the monitoring arrangement judges that all of the channel codes are stored in the memory unit 30. The erasing arrangement carries out the seventeenth and the twenty-second stages $S_{17}$ and $S_{22}$. Alternatively, the erasing arrangement erases all of the channel codes from the memory unit 30 when the manually operable switch 23 is pressed after the monitoring arrangement judged that all of the channel codes are stored in the memory unit 30.

In the event that the erasing arrangement is put into operation, the controller 14 serves as an idle state establishing arrangement for putting the station into the idle state after the erasing arrangement erases all of the channel codes from the memory unit 30. This operation is indicated in FIG. 4 by a line drawn from the twenty-second step $S_{22}$ back to the fourth step $S_4$.

Figure 5A:
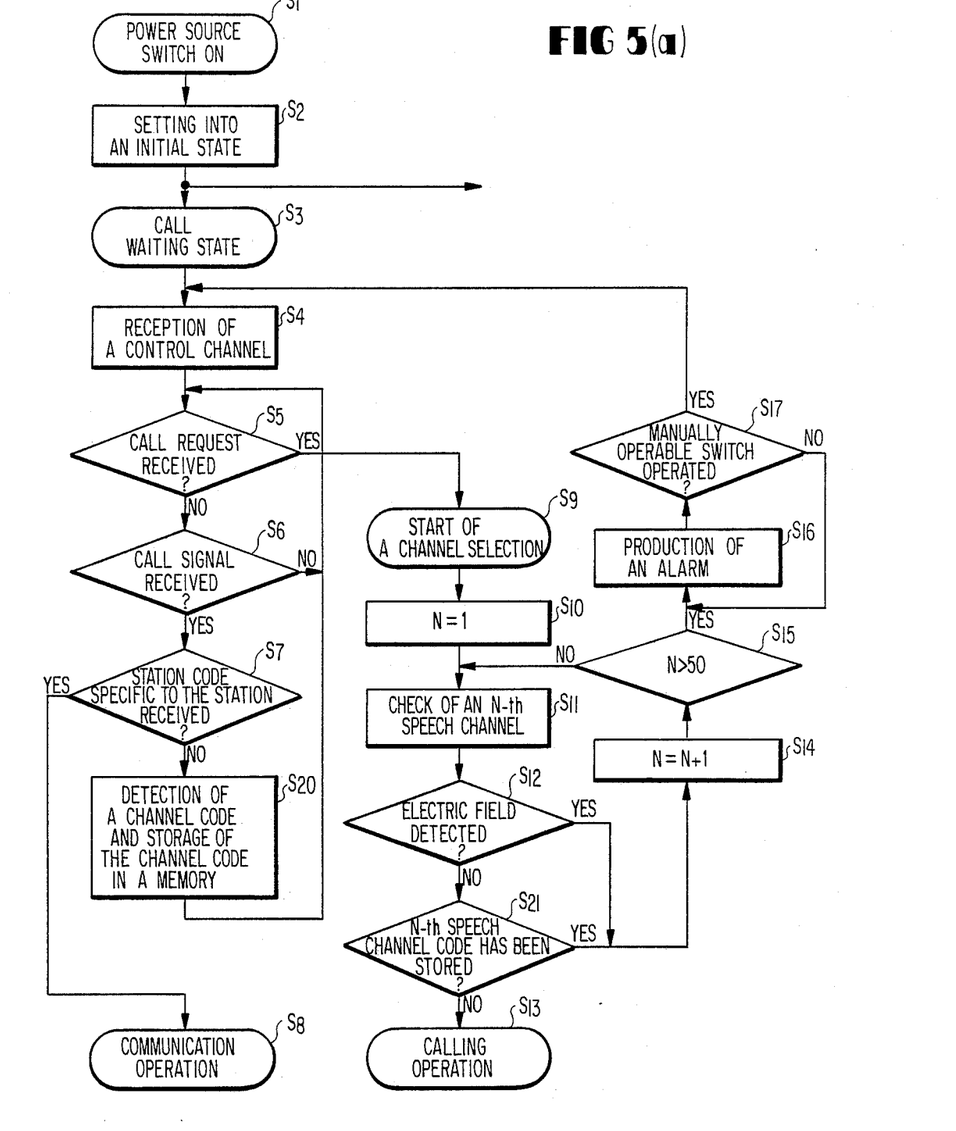
Figure 5B:
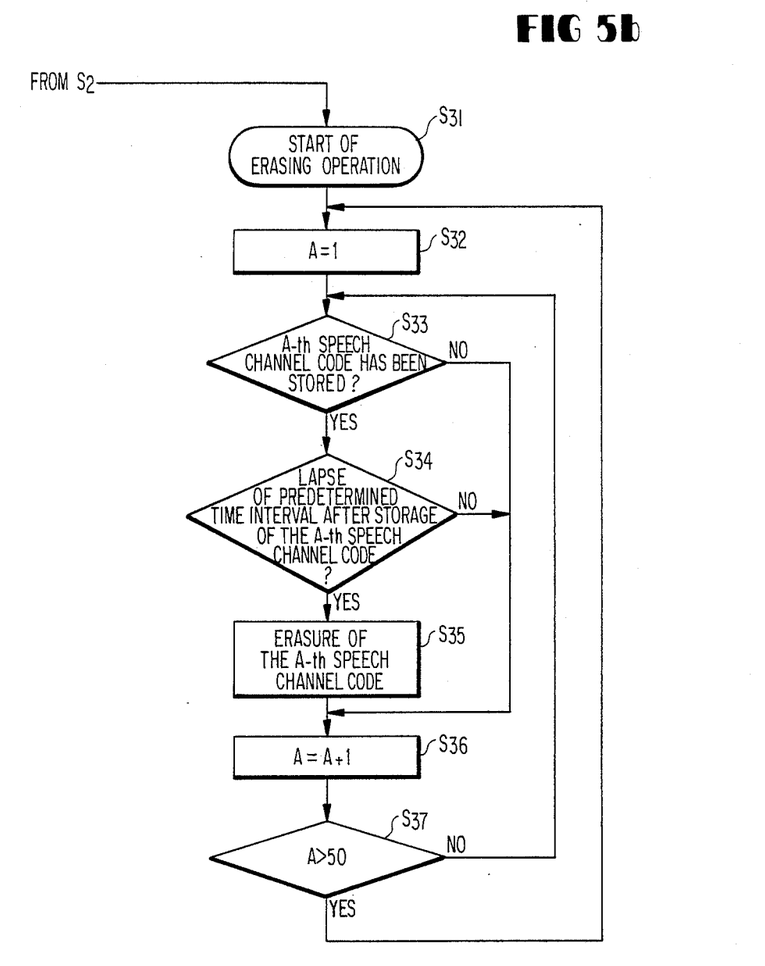

Referring to FIGS. 5(a) and (b) and again to FIG. 3, operation of a channel selecting device according to a second embodiment of this invention will be described. The channel selecting device has a structure which is similar to that illustrated in FIG. 3 except the erasing operation for the memory unit 30. The description will mainly be directed to the erasing operation.

A station with the channel selecting device is set into an initial state by resetting the controller 14 at the second stage $S_2$ in the manner described above. The second stage $S_2$ is succeeded not only by the third stage $S_3$ but also by a novel stage which will be called a thirty-first stage $S_{31}$ and at which the erasing operation starts. That is, the station not only carries out a call waiting operation for a call signal at the third stage $S_3$ but also starts the erasing operation. One of the speech channels will be represented by an additional variable A. The controller 14 sets the variable A at 1 at a thirty-second stage $S_{32}$ which succeeds the thirty-first stage $S_{31}$. It should be understood that the controller 14 is put in a set state in this manner. Like the first-mentioned variable N, the additional variable A is successively increased one by one. It will be assumed that the additional variable A represents an integer A with the same reference letter used. The integer A represents an A-th channel of the speech channels. The thirty-second stage $S_{32}$ is followed by a thirty-third stage $S_{33}$ at which the controller 14 detects whether or not the channel code of the A-th channel is already stored in the memory unit 30. When the A-th channel code is stored, the thirty-third stage $S_{33}$ proceeds to a thirty-fourth stage $S_{34}$. At the thirty-fourth stage $S_{34}$, the controller 14 detects whether or not a predetermined time interval of, for example, fifteen minutes has lapsed after storage of the A-th channel code in the memory unit 30. When the predetermined time interval lapses, the thirty-fourth stage $S_{34}$ is followed by a thirty-fifth stage $S_{35}$ at which the controller 14 erases the A-th channel code.

Otherwise, the thirty-fourth stage $S_{34}$ is followed by a thirty-sixth stage $S_{36}$ at which the controller 14 carries out counting up the additional variable A. When the A-th channel code is not found in the memory unit 30, the thirty-third stage $S_{33}$ proceeds also to the thirty-sixth stage $S_{36}$. The thirty-sixth stage $S_{36}$ is followed by a thirty-seventh stage $S_{37}$ at which the controller 14 detects whether or not the additional variable A is greater than the number of all speech channels, namely, fifty. When the additional variable A is not greater than fifty, the thirty-seventh stage $S_{37}$ returns to the thirty-third stage $S_{33}$. Otherwise, the thirty-seventh stage $S_{37}$ returns to the thirty-second stage $S_{32}$.

It is now understood that an erasing arrangement is formed by a combination of the controller 14, the receiving circuit 12, and the frequency synthesizer 11. Coupled to the memory unit 30, the erasing arrangement erases each of the channel codes from the memory unit 30 upon lapse of a predetermined time interval after storage of that channel code in the memory unit 30.

Reviewing FIGS. 3 through 5, it should be understood that the channel selecting device is for use in a station of a multichannel access radio communication system. While the station is in an idle state, operation is carried out to detect channel codes of busy channels which are rendered busy among speech channels by at least two of the other stations of the system. The memory unit 30 stores channel codes of the busy channels. When the first-mentioned station starts communication with a specific station of the other stations, the above-defined channel selector refers to the memory unit 30 for the channel codes and selects one speech channel as a selected channel from idle channels which are other than the busy channels among the speech channels. Inasmuch as reference is had to the memory unit 30 so that each of the busy channels is never selected as the selected channel, it is possible to avoid the above-mentioned interference among the above-discussed first, second, and the third and fourth stations.

While this invention has thus far been described in conjunction with a few preferred embodiments thereof, it will readily be possible for those skilled in the art to put this invention into practice in various other manners. For example, the channel selecting device can be used in a multichannel access radio communication system which comprises other communication channels instead of the speech channels in the manner noted hereinabove.

What is claimed is:

1. In a station of a multichannel access radio communication system, said system comprising said station, a plurality of other stations, a control channel and a predetermined number of communication channels, each of said communication channels having respective channel codes, said station and said other stations each comprising a personal radio transceiver, a channel selecting device comprising:

channel selecting means for selecting one of said communication channels as a selected channel on starting communication with a specific station of said other stations of said system, said communication being carried out between said station and said specific station by use of said selected channel in a simplex transmission mode;

detecting means for coupling to said control channel and for detecting the channel codes of busy channels which are rendered busy among said communication channels by at least two of said other stations, said channel codes of busy channels being transmitted through said control channel, said detecting means being operable while the first-mentioned station is in an idle state; and storing means coupled to said detecting means for storing the channel codes of said busy channels;

said channel selecting means being coupled to said storing means to select said selected channel from idle channels which are other than said busy channels.

2. A channel selecting device as claimed in claim 1, further comprising erasing means for erasing each of said channel codes from said storing means after a lapse of a predetermined time interval after storage of said each of the channel codes in said storing means.

3. A channel selecting device as claimed in claim 1, wherein said storing means comprises memory means coupled to said detecting means for memorizing the channel codes of said busy channels and supervising means coupled to said memory means for supervising whether or not all of said channel codes are stored in said memory means.

4. A channel selecting device as claimed in claim 3, wherein said supervising means comprises:

monitoring means for monitoring said memory means to judge whether or not all of said channel codes are memorized in said memory means; and erasing means coupled to said memory means and said monitoring means for erasing said all of the channel codes from said memory means when said monitoring means judges that said all of the channel codes are memorized in said memory means.

5. A channel selecting device as claimed in claim 4, further comprising bistable means having a set and a reset state when a call request is received and while no call request is received, respectively, and a manually operable switch for forcibly putting said bistable means into said reset state, wherein said erasing means erases said all of the channel codes from said memory means when said manually operable switch is operated after said monitoring means judges that said all of the channel codes are memorized in said memory means.

6. A channel selecting device as claimed in claim 5, further comprising idle state establishing means coupled to said erasing means for putting said first-mentioned station into said idle state after said erasing means erases said all of the channel codes from said memory means.

* * * * *